United States Patent [19]
Hanke et al.

[11] Patent Number: 5,230,013
[45] Date of Patent: Jul. 20, 1993

[54] PLL-BSGED PRECISION PHASE SHIFTING AT CMOS LEVELS

[75] Inventors: C. Christopher Hanke, Mesa; Ray D. Sundstrom, Chandler, both of Ariz.

[73] Assignee: Motorola, Inc., Schaumburg, Ill.

[21] Appl. No.: 864,247

[22] Filed: Apr. 6, 1992

[51] Int. Cl.$^5$ .............................................. H03D 3/24
[52] U.S. Cl. ..................................... 375/119; 307/475
[58] Field of Search ....................... 375/118, 119, 120; 307/455, 475, 511; 328/133, 155

[56] References Cited

U.S. PATENT DOCUMENTS

| | | | |
|---|---|---|---|
| 4,641,322 | 2/1987 | Tsang | 375/119 |
| 5,161,173 | 11/1992 | Nordby | 375/120 |
| 5,162,746 | 11/1992 | Ghoshal | 375/120 |

*Primary Examiner*—Stephen Chin
*Attorney, Agent, or Firm*—Bradley J. Botsch, Sr.

[57] ABSTRACT

A circuit for generating precise, phase shifted, CMOS level output signals with respect to an input data signal has been provided. The circuit utilizes a phase-locked loop for generating a precise clock signal. This precise clock signal is then utilized to clock a plurality of serially-coupled flip-flops wherein two-times the input data signal is applied to the data input of the first serially-coupled flip-flop. The outputs of the serially-coupled flip-flops are ECL signals which are then translated to CMOS level signals via ECL-CMOS translators. Finally, the output signals of the translators are respectively used to clock divide-by-two configured flip-flops in order to provide the plurality of precise, phase shifted CMOS output signals. The plurality of precise, phase shifted, CMOS output signals have a 50% duty cycle and represent phase shifted versions of the input data signal wherein the minimum time delay between signals is substantially equal to the period of the precise clock signal.

6 Claims, 2 Drawing Sheets

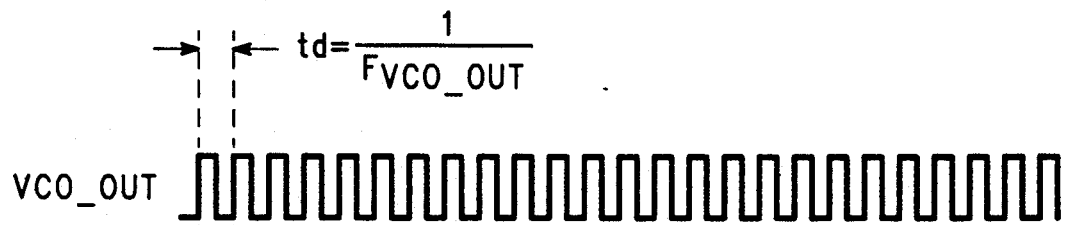
FIG. 2
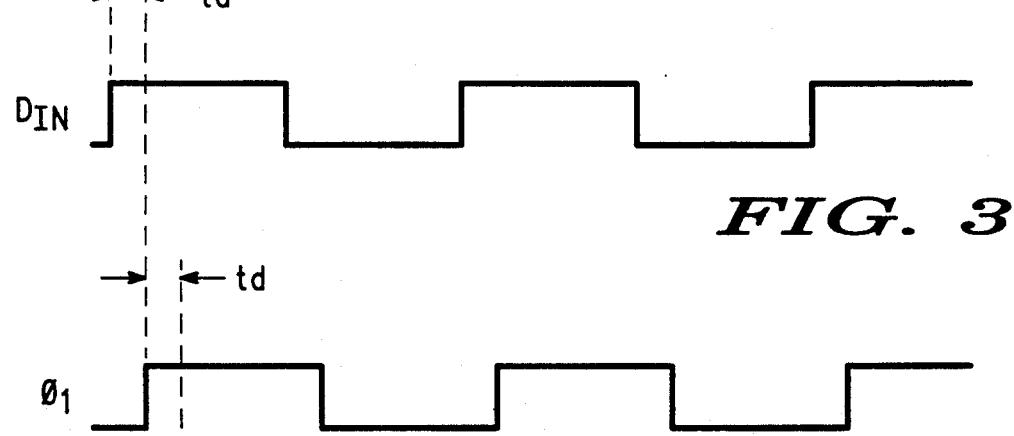
FIG. 3
FIG. 4
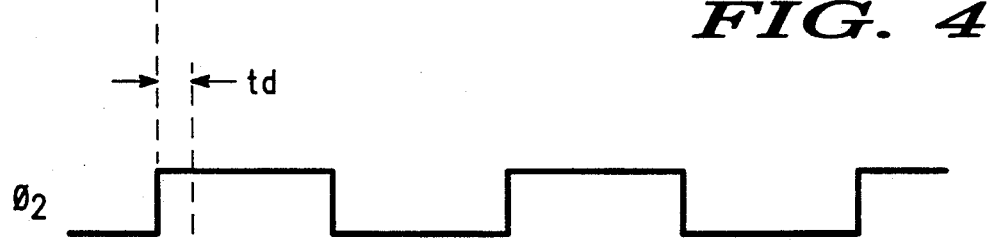
FIG. 5
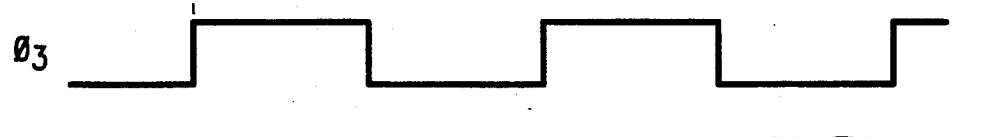
FIG. 6

PLL-BSGED PRECISION PHASE SHIFTING AT CMOS LEVELS

FIELD OF THE INVENTION

This invention relates to phase shifting circuits and, in particular, to a circuit utilizing a phase-locked loop for providing phase shifted clock output signals with respect to an input data signal.

BACKGROUND OF THE INVENTION

There exist of myriad of applications where a CMOS circuit requires precise phase shifted clock outputs, for example, when one signal must be guaranteed to arrive by an exact amount of time before (or after) another signal.

The typical method of achieving a predetermined delay at CMOS levels is to utilize CMOS buffers to create a predetermined delay. However, the disadvantage of this method is that the precision of the delay is very inaccurate. For example, to achieve a two nanosecond delay, the precision may at best be $+/-500$ picoseconds. This lack of precision is primarily due to CMOS transistor sensitivity to process, temperature and voltage variations.

Another attempt at generating precise multi-phase clock outputs has been implemented by Gazelle (now part of TriQuint Semiconductor) on part number GA1110. A technique is disclosed for achieving precise phase shifted output wherein the minimum delay is equal to the period of a clock signal. This clock signal is created by multiplying up a relatively low frequency signal to a high frequency internal signal via a phase-locked loop. The phase shifted outputs are provided by clocking a string of serially-coupled D-flip flops. Each D-flip flop inserts one period shift (or delay) in relation to the previous flip flop. Thus, the higher the frequency of the internal clock signal, the smaller the delay increment between each skewed clock signal. For example, at a clock frequency of 500 MHz, the minimum delay between the outputs will be two nanoseconds. The delay increment will be precise because the clock is locked to an external phase-locked loop. However, Gazelle only provides TTL compatible outputs. Further, Gazelle utilizes gallium arsenide technology to implement the internal circuitry that operates at high frequencies and generate the internal clock signal. This concept can not be applied to provide CMOS output levels because in order to achieve precise delays as small as two nanoseconds, CMOS circuits would have to run at 500 MHz. Such a circuit would be impractical and difficult to manufacture.

Hence, a need exists for a circuit that provides CMOS level phase shifted clock output signals with respect to an input data signal.

SUMMARY OF THE INVENTION

Briefly, there is provided a circuit for providing a plurality of precise, phase shifted, CMOS output signals with respect to an input data signal, comprising a phase-locked loop having an input and an output, the input of the phase-locked loop being responsive to the input data signal, the output of the phase-locked loop providing an output signal that is multiplied up in frequency by a first predetermined factor with respect to the input data signal; a divide-by N counter having an input an output, the input of the divide-by N counter being responsive to the output signal of the phase-locked loop; a plurality of serially-coupled shift registers each having a data input, a clock input and an output, the plurality of serially-coupled shift registers being coupled such that the data input of each one of the plurality of serially-coupled shift registers are coupled to the output of a previous adjacent shift register and where the data input of a first one of the plurality of serially-coupled shift registers are coupled to the output of a previous adjacent shift register and where the data input of a first one of the plurality of serially-coupled shift registers is coupled to the output of the divide-by N counter, the clock inputs of each of the plurality of serially-coupled shift registers being coupled to receive the output signal of the phase-locked loop, the outputs of the plurality of serially coupled shift registers providing a plurality of output signals; a plurality of ECL-CMOS translator circuits each having an input and an output, the inputs of the plurality of ECL-CMOS translator circuits being respectively coupled to receive the plurality of output signals of the plurality of serially-coupled shift registers, the outputs of the plurality of ECL-CMOS translator circuits providing a plurality of CMOS level output signals; and a plurality of divide-by two circuits each having an input and an output, the inputs of the plurality of divide-by two circuits being respectively coupled to receive the plurality of CMOS level output signals, the outputs of the plurality of divide-by two circuits being respectively coupled to provide the plurality of precise, phase shifted, CMOS output signals.

The present invention will be better understood from the following detailed description taken in conjunction with the accompanying drawings.

BRIEF DESCRIPTION OF THE DRAWINGS

FIGS. 2-6 are graphical waveforms illustrating the phase shifted outputs signals with respect to the data input signal.

DETAILED DESCRIPTION OF THE DRAWINGS

Figure 1:
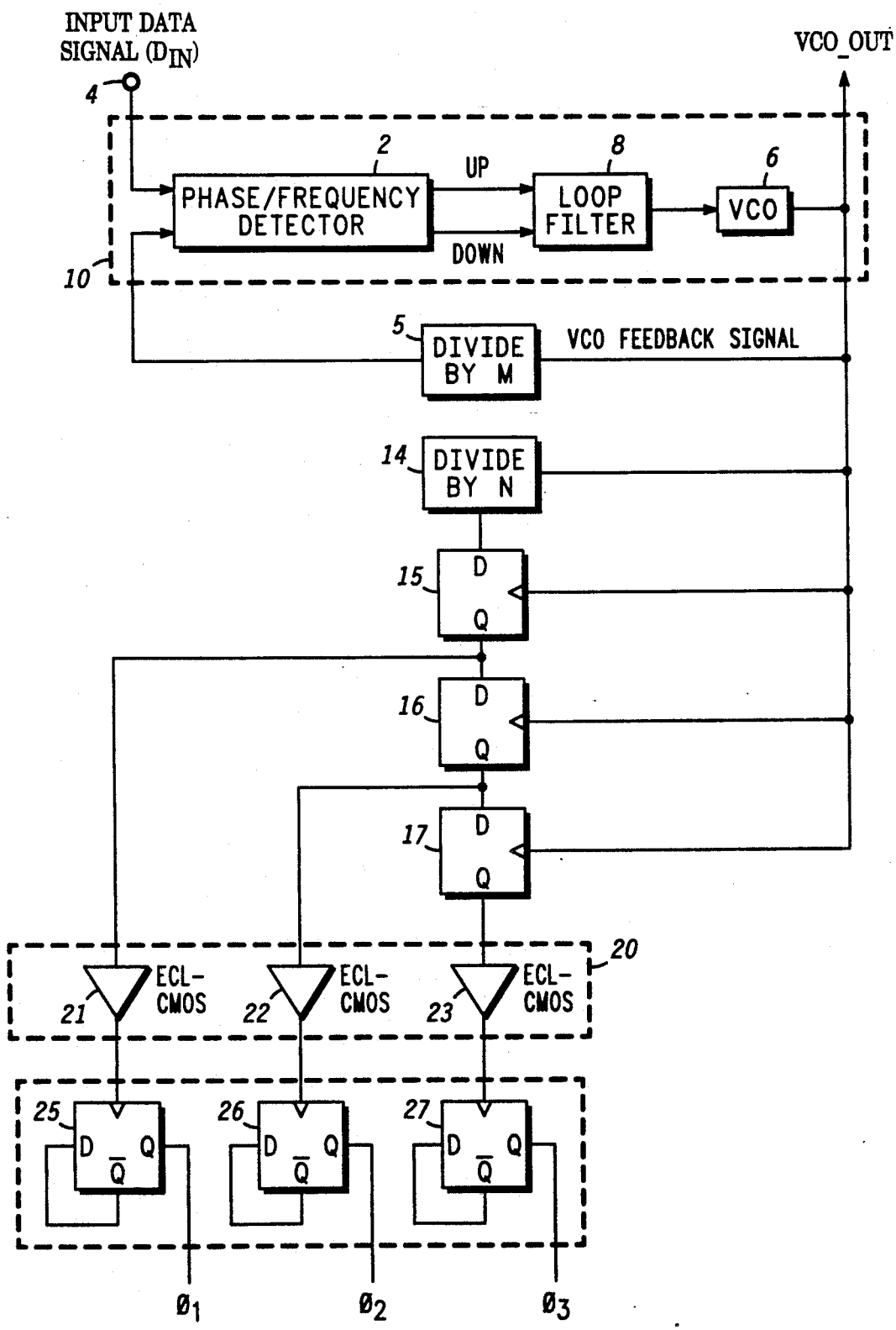
FIG. 1 is a block diagram illustrating a circuit utilizing a phase-locked loop (PLL) for generating PLL-based precision phase shifted output signals at CMOS levels in accordance with the present invention.

Referring to FIG. 1, a block diagram illustrating a circuit utilizing phase-locked-loop (PLL) 10 for generating PLL-based precision phase shifted output signals at Complementary Metal-Oxide Semiconductor (CMOS) levels is shown comprising phase/frequency detector 2 having a first input coupled to input terminal 4 and a second input coupled to an output of divide-by M counter 5. The first output of phase/frequency detector 2 is coupled to a first input of loop filter 8, while the second output of phase/frequency detector 2 is coupled to a second input of loop filter 8. The output of loop filter 8 is coupled to an input of VCO 6 while an output of VCO 6 is coupled to an input of divide-by M counter 5. It should be known by one of ordinary skill in the art that the phase-lock-loop circuit comprises phase/frequency detector 2, loop filter 8 and VCO 6 as shown in block 10.

The output of VCO 6 is coupled to an input of divide-by N counter 14 and to the clock inputs of serially-coupled shift registers (flip flops) 15-17. The output of divide-by N counter 14 is coupled to the data input of flip flop 15. Flip flops 15-17 are serially-coupled in that the output of flip flop 15 is coupled to the data input of flip flop 16 while the output of flip flop 16 is coupled to the data input of flip flop 17. Flip flops 15, 16 and 17 are designed using internal differential Emitter-coupled Logic (ECL) circuitry as well as phase-locked loop circuit 10 and divide-by counters 5 and 14 wherein ECL technology allows for high frequency operation.

The outputs of flip flops 15, 16 and 17 are coupled to ECL-CMOS translator block 20. In particular, the output of flip flop 15 is coupled to an input of ECL-CMOS translator 21. Similarly, the output of flip flop 16 is coupled to the input of ECL-CMOS translator 22 and the output of flip flop 17 is coupled to the input of ECL-CMOS translator 23. The outputs of translators 21-23 are respectively coupled to the clock inputs of flip flops 25-27. Flip flops 25-27 are configured in a divide-by two mode wherein the inverting output of each is coupled back to its data input. Further, the non-inverting outputs of flip flops 25-27 respectively provide phase shifted output signals $\phi_1$, $\phi_2$ and $\phi_3$.

In operation, phase/frequency detector 2 compares the input data signal ($D_{IN}$) applied at terminal 4 with the output signal of divide-by M counter 5 and provides UP and DOWN output signals. If the divide-by M counter output signal is at a lower frequency than the input data signal, then the UP signal will be in a first logic state thereby increasing the output frequency of the VCO, signal VCO_OUT. Likewise, if the divide-by M counter output signal is at a higher frequency than the input data signal, then the DOWN signal will be in a first logic state thereby decreasing the frequency of signal VCO_OUT. When both the UP and DOWN signals are in a second logic state, the divide-by M counter output signal is substantially the same phase and frequency of the input data signal, and the frequency of the VCO output signal is substantially M times the frequency of the input data signal. Thus, if M=10 and the input data signal is 50 MHz, then the frequency of signal VCO_OUT is substantially equal to 500 MHz. Similarly, the frequency of the output signal of divide-by N counter 14 is substantially equal to $F_{OSC-OUT}/N$. Further, if N=5 in our previous example, the output signal of divide-by N counter 14 is 100 MHz. It is worth noting that, in general, counters 5 and 14 are divide-by counters and are not restricted to M=10 and N=5, respectively. However, the divide-by ratio of counter 5 is twice the divide-by ratio for counter 14 (N=M/2) so that the frequency of the data signal applied to flip flop 15 is substantially twice the frequency of the input data signal applied at terminal 4. This allows for a 50% duty cycle for phase shifted output signals $\phi_1$, $\phi_2$ and $\phi_3$ as will be described hereinafter.

It is important to realize that flip flops 15-17 as well as phase-locked loop 10 and counters 5 and 14 are implemented by utilizing differential ECL circuitry. This allows signal $VCO_{-OUT}$ to operate at a substantially high frequency, such as 500 MHz, which is typically not a problem for ECL technology. Further, the outputs of flip flops 15-17 are ECL level signals operate at a frequency substantially equal to the frequency provided at the output of divide by N counter 14 (which is two times the frequency of signal $D_{IN}$) and are separated in phase by a minimum time interval substantially equal to $1/F_{OSC-OUT}$. Thus, for our example, the signals appearing at the outputs of flip flops 15-17 are operating at a data rate of 100 MHz and are shifted in time by two nanoseconds (1/500 MHz). It is important to realize that this time shift is precise since it is generated from the output clock frequency of a phase locked loop.

These ECL level signals are then converted to CMOS level signals via ECL-CMOS translators 21-23. ECL-CMOS translator 21-23 are CMOS level signals at a data rate of two times the frequency of signal $D_{IN}$ and are precisely skewed by a minimum time interval of $1/F_{OSC-OUT}$.

Finally, the output signals of ECL-CMOS translators 21-23 are respectively applied to the clock inputs of divide-by two configured flip flops 25-27. As a result, output signals $\phi_1$, $\phi_2$ and $\phi_3$ operate at a frequency substantially equal to the frequency of the input data signal ($D_{IN}$) and are skewed by a minimum time interval substantially equal to $1/F_{VCO-OUT}$. Further, the divide-by two configured flip flops ensure that signals $\phi_1$, $\phi_2$ and $\phi_3$ have a duty cycle substantially equal to 50%.

It should be realized that although only three phase shifted output signals are shown, $\phi_1$, $\phi_2$, $\phi_3$, this concept is easily extended to provide any number of phase shifted output signal. Thus, if N output signals were desired, this would require N serially-coupled shift registers (similar to shift registers 15-17), N CMOS-ECL translators (similar to translators 21-23) and N divide-by two configured flip flops (similar to flip flops 25-27). Further, it should be realized that the number of possible phase shift output signals is determined by the ratio of (frequency of signal $VCO_{-OUT}$/frequency of the signal applied at the data input of flip flop 15) which is N (the divide factor of counter 14). Thus, in our example, if N=5, five distinct phase shifted output signals could be generated since the sixth phase shifted output signal would be a duplicate of the first phase shifted signal.

Referring to FIGS. 2-6, graphical waveforms illustrating the phase shifted clock output signals $\phi_1$, $\phi_2$ and $\phi_3$ with respect to the data input signal $D_{IN}$ are shown. In particular, FIG. 2 shows a typical VCO_OUT signal that is operating at a frequency that is denoted by $F_{OSC-OUT}$. FIG. 3 shows a typical data input signal which is applied at terminal 4 and operating at a much lower frequency than signal $OSC_{13} OUT$ due to divide-by M counter 5. FIG. 4 shows signal $\phi_1$ which is operating at the same frequency as signal $D_{IN}$ but is shifted in time by the time interval denoted by $t_d$ wherein time interval $t_d$ is substantially equal to $1/F_{OSC-OUT}$. Likewise, FIG. 5 shows signal $\phi_2$ which is operating at the same frequency as signal $D_{IN}$ but is shifted in time with respect to signal $\phi_1$ by a time interval $t_d$. Finally, FIG. 6 shows signal $\phi_3$ which is operating at the same frequency as signal $D_{IN}$ but is shifted in time with respect to signal $\phi_1$ by a time interval $t_d$. Thus, signals $\phi_1$, $\phi_2$ and $\phi_3$ represent precise phase shifted versions of input signal $D_{IN}$, and are delayed by a minimum time interval substantially equal to $1/F_{OSC-OUT}$.

By now it should be appreciated from the foregoing discussion that a novel circuit for generating precise, phase shifted, CMOS level clock output signals with respect to an input data signal has been provided. The circuit includes a phase-locked loop for generating a precise clock signal. This precise clock signal is then utilized to clock a plurality of serially-coupled flip-flops wherein two-times the input data signal is applied to the data input of the first serially-coupled flip-flop. The outputs of the serially-coupled flip-flops are ECL signals which are then translated to CMOS level signals via ECL-CMOS translators. Finally, the output signals of the translators are respectively used to clock divide-by-two configured flip-flops in order to provide a plurality of phase shifted output signals. The plurality of phase shifted output signals represent precise phase shifted versions of the input data signal which are time delayed by the period of precise clock signal and have a duty cycle substantially equal to 50%.

While the invention has been described in conjunction with specific embodiments thereof, it is evident that many alterations, modifications, and variations will be apparent to those skilled in the art in the light of the foregoing description. Accordingly, it is intended to embrace all such alterations, modifications, and variations in the appended claims.

What is claimed is:

1. A circuit for providing a plurality of precise, phase shifted, Complementary Metal-Oxide Semiconductor (CMOS) output signals with respect to an input data signal, comprising:
   a phase-locked loop having an input and an output, said input of said phase-locked loop being responsive to the input data signal, said output of said phase-locked loop providing an output signal that is multiplied up in frequency by a first predetermined factor with respect to the input data signal;
   a divide-by N counter having an input and an output, said input of said divide-by N counter being responsive to said output signal of said phase-locked loop;
   a plurality of serially-coupled shift registers each having a data input, a clock input and an output, said plurality of serially-coupled shift registers being coupled such that said data input of each one of said plurality of serially-coupled shift registers are coupled to said output of a previous adjacent shift register and where said data input of a first one of said plurality of serially-coupled shift registers is coupled to said output of said divide-by N counter, said clock inputs of each of said plurality of serially-coupled shift registers being coupled to receive said output signal of said phase-locked loop, said outputs of said plurality of serially coupled shift registers providing a plurality of output signals;
   a plurality of Emitter-Coupled Logic-Complementary Metal-Oxide Semiconductor (ECL-CMOS) translator circuits each having an input and an output, said inputs of said plurality of ECL-CMOS translator circuits being respectively coupled to receive said plurality of output signals of said plurality of serially-coupled shift registers, said outputs of said plurality of ECL-CMOS translator circuits providing a plurality of CMOS level output signals; and
   a plurality of divide-by two circuits each having an input and an output, said inputs of said plurality of divide-by two circuit being respectively coupled to receive said plurality of CMOS level output signals, said outputs of said plurality of divide-by two circuits being respectively coupled to provide the plurality of precise, phase shifted, CMOS output signals.

2. The circuit according to claim 1 wherein said output signals of said plurality of serially-coupled shift registers are ECL signals.

3. The circuit according to claim 1 wherein the plurality of precise, phase shifted, CMOS output signals have a 50% duty cycle.

4. The circuit according to claim 1 wherein said phase-locked loop, said divide-by N counter and said plurality of serially-coupled shift registers are implemented in ECL technology.

5. The circuit according to claim 1 wherein each one of said plurality of divide-by two circuits includes a D flip flop having a data and a clock input and non-inverting and inverting outputs, said inverting output of said D flip flop being coupled back to said data input of said D flip flop, said clock input being coupled to receive one of said plurality of CMOS level output signals of said plurality of serially-coupled shift registers, said non-inverting output being coupled to provide one of the plurality of precise, phase shifted, CMOS output signals.

6. A method for providing a plurality of precise, phase shifted, Complementary Metal-Oxide Semiconductor (CMOS) output signals with respect to an input data signal, the method comprising the steps of:
   (a) multiplying the input data signal up in frequency by a predetermined factor via a phase-locked loop and thereby providing a precise clock signal;
   (b) generating a multiplied data signal whose frequency is substantially equal to two times the frequency of the input data signal;
   (c) applying said precise clock signal to clock inputs of a plurality of serially-coupled shift registers and applying said multiplied data signal to a data input of a first one of said plurality of phase shifted signals for generating a plurality of phase shifted Emitter-Coupled Logic (ECL) signals;
   (d) translating said plurality of phase shifted ECL signals to a plurality of CMOS phase shifted signals; and
   (e) dividing said plurality of CMOS phase shifted signals by two to provide the plurality of precise, phase shifted, CMOS output signals, each one of the plurality of precise, phase shifted, CMOS output signals having a 50% duty cycle and being shifted in time with respect to each adjacent other by a time substantially equal to the period of said precise clock signal.

* * * * *

UNITED STATES PATENT AND TRADEMARK OFFICE
CERTIFICATE OF CORRECTION

PATENT NO. : 5,230,013

DATED : July 20, 1993

INVENTOR(S) : C. Christopher Hanke, et al

It is certified that error appears in the above-indentified patent and that said Letters Patent is hereby corrected as shown below:

On the Title Page, Item[54], please delete the word "BSGED" and insert the word --BASED--.

Signed and Sealed this

Nineteenth Day of April, 1994

Attest:

BRUCE LEHMAN

Attesting Officer      Commissioner of Patents and Trademarks